United States Patent
Kaneko

(10) Patent No.: US 7,777,582 B2
(45) Date of Patent: Aug. 17, 2010

(54) CLOCK GENERATOR

(75) Inventor: Yoshio Kaneko, Kashiwa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 12/190,932

(22) Filed: Aug. 13, 2008

(65) Prior Publication Data

US 2009/0134945 A1    May 28, 2009

(30) Foreign Application Priority Data

Nov. 26, 2007   (JP)   ............................ 2007-304711

(51) Int. Cl.
*H03B 27/00* (2006.01)
*H03K 3/03* (2006.01)
(52) U.S. Cl. .......................................... 331/57; 331/176
(58) Field of Classification Search ................ 331/57, 331/176, 70
See application file for complete search history.

(56) References Cited

U.S. PATENT DOCUMENTS

| | | | |
|---|---|---|---|
| 4,980,586 A * | 12/1990 | Sullivan et al. | 327/262 |
| 5,994,971 A | 11/1999 | Edwards | |
| 6,008,686 A | 12/1999 | Suda | |
| 6,060,929 A | 5/2000 | Takaki et al. | |
| 6,329,642 B1 * | 12/2001 | Kaneko et al. | 219/497 |

* cited by examiner

*Primary Examiner*—Joseph Chang
(74) *Attorney, Agent, or Firm*—Turocy & Watson, LLP

(57) ABSTRACT

A clock generator has a ring oscillator which has odd-numbered inverters connected in series, wherein an output of the inverter at a final stage is inputted into the inverter at a first stage to generate and output a clock signal, a frequency divider which receives the clock signal outputted from the ring oscillator, and divides frequency thereof for output, and a heater which is on-off controlled based on the output of the frequency divider and heats the ring oscillator when turned on.

18 Claims, 7 Drawing Sheets

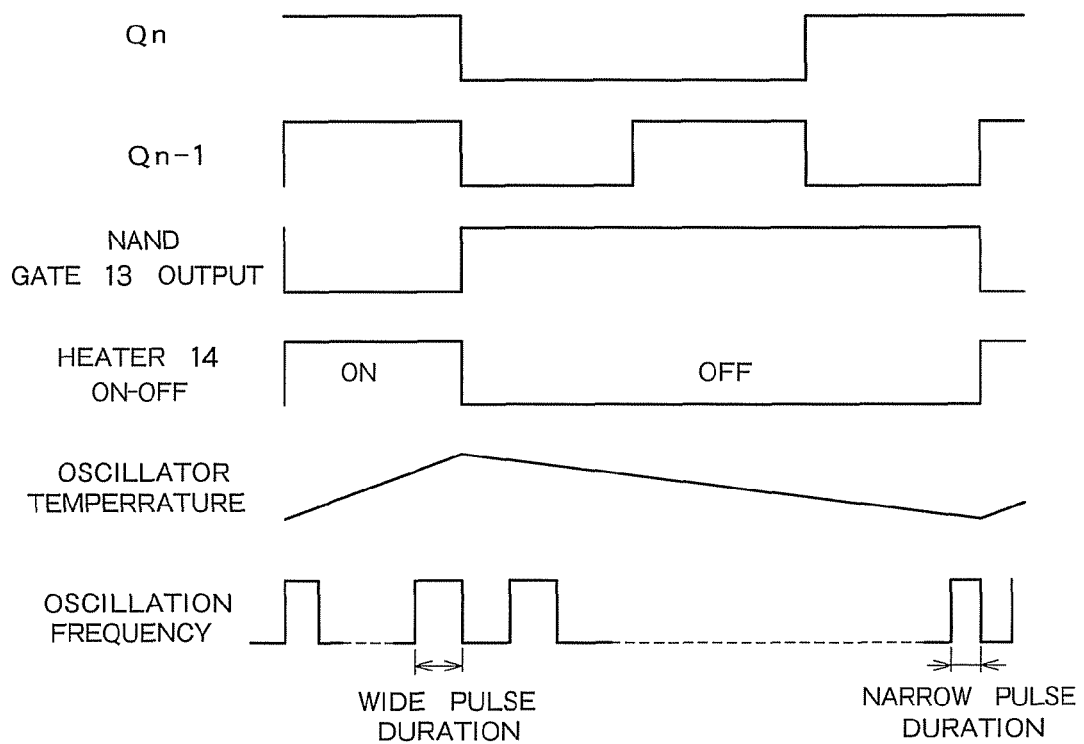
F I G. 3
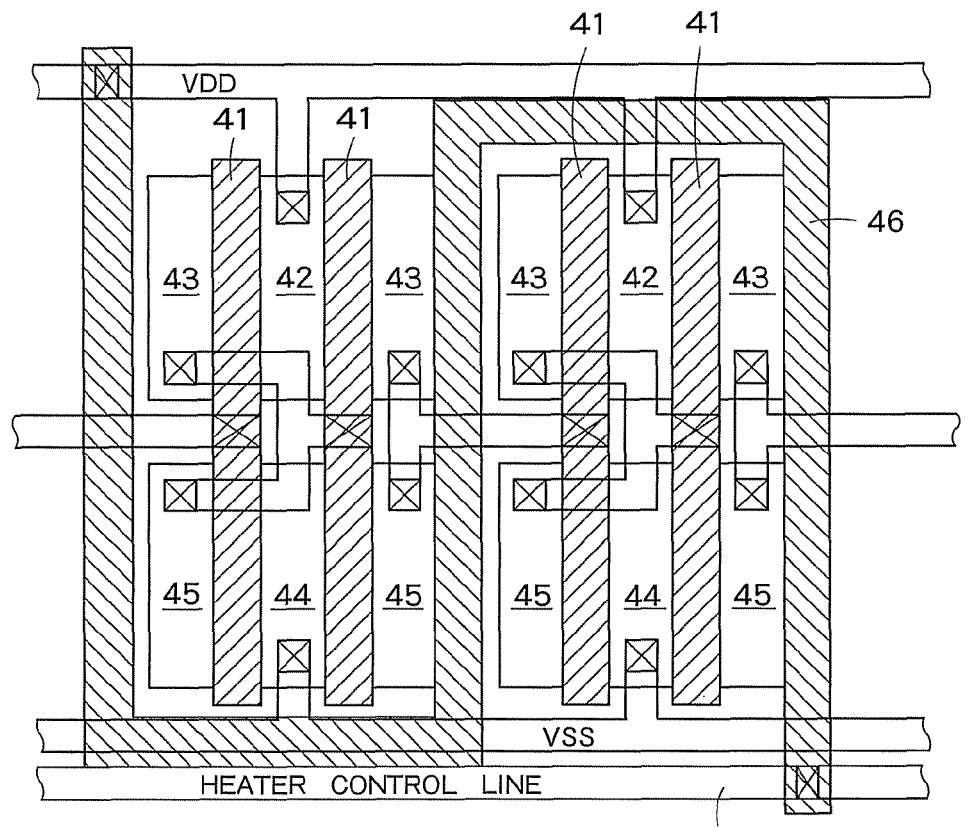
F I G. 4

(a)

(b)

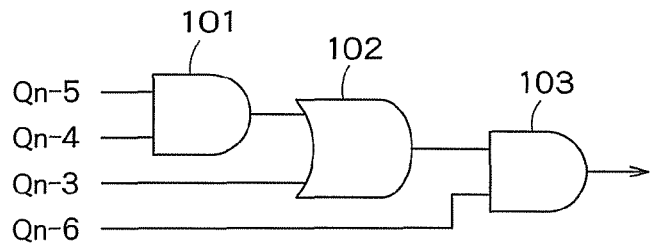
F I G. 10
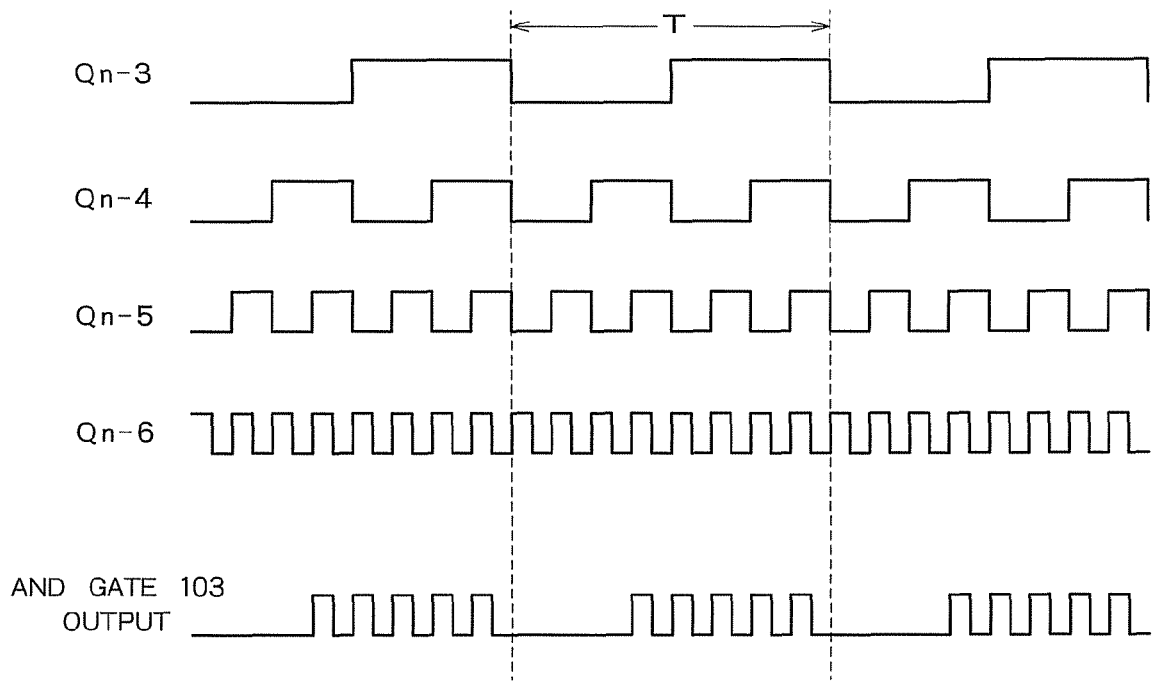
F I G. 11
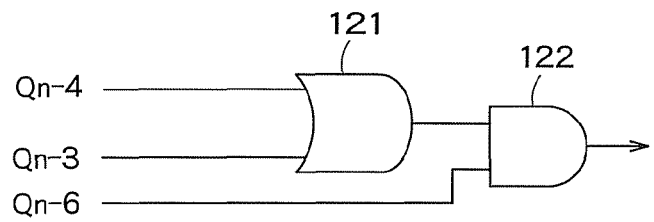
F I G. 12

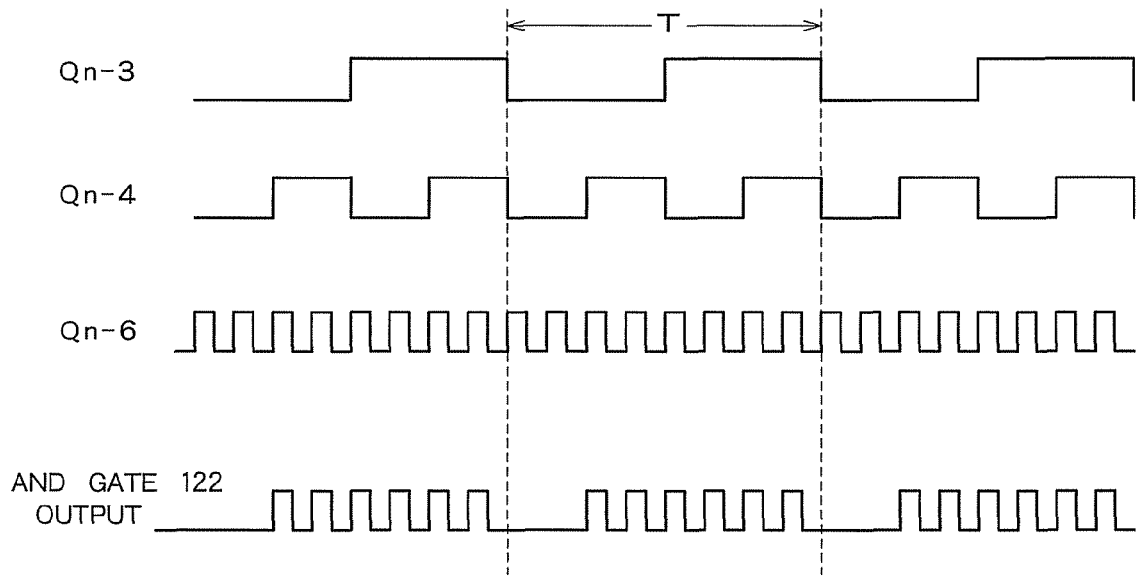
F I G. 13
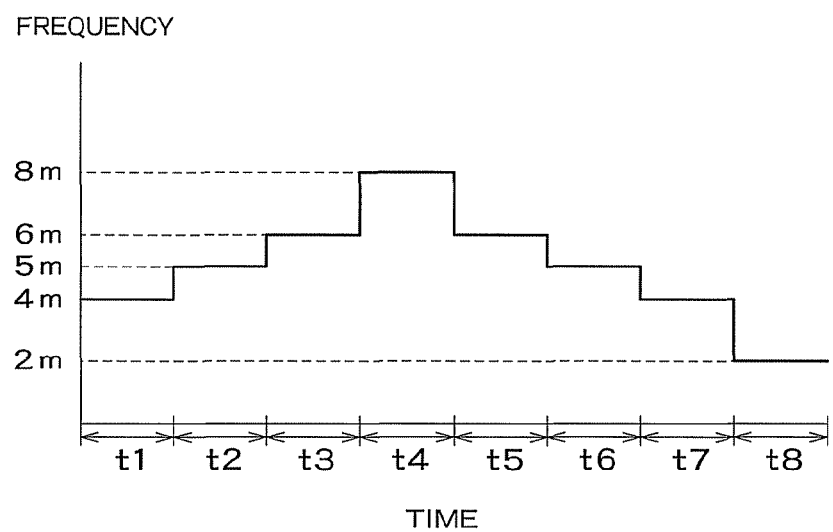
F I G. 14

CLOCK GENERATOR

CROSS REFERENCE TO RELATED APPLICATION

This application is based upon and claims the benefit of priority from the Japanese Patent Application No. 2007-304711, filed on Nov. 26, 2007, the entire contents of which are incorporated herein by reference.

BACKGROUND OF THE INVENTION

The present invention relates to a clock generator.

It has been known that a clock signal or a data signal changing synchronously with the clock signal generates electromagnetic interference, hereinafter referred to as "EMI". In recent years, the required frequency of a clock signal becomes higher and measures against EMI are in demand.

To suppress EMI noise, there has been proposed a spread spectrum clock generator (SSCG) which gives minute oscillations to the clock frequency relative to a clock signal resulting in noise and reduce the strength (amplitude) of a noise spectrum by means of a smoothing action with the oscillations.

However, the conventional SSCG uses a PLL circuit, which causes a function of SSCG to come into no action until the PLL circuit has stabilized and is unsuitable to a system which frequently switches turning on and off a power supply. There is also a problem of a cost increase due to use of a PLL circuit.

As a SSCG having no PLL circuit, there has been proposed an apparatus which gives oscillations to a reference frequency by inputting an input pulse (a clock signal of the reference frequency) into a delay circuit including a plurality of delay buffers connected in series and outputting an output of the delay buffer selected by switching as needed as an output pulse.

It has been known that what has a large effect in EMI noise reduction is the one that gives periodical waveform fluctuations to a reference clock, such as Hershey Kiss waveform. The apparatus described above has a reference frequency as an output pulse during a period except instantaneous switching period of a delay time (selected delay buffer) and therefore an EMI reduction effect is small.

Accordingly, there has been requested a clock generator which has a simple circuit configuration without PLL circuit and can generate a clock signal having a steadily oscillating frequency.

SUMMARY OF THE INVENTION

According to one aspect of the present invention, there is provided a clock generator comprising:

a ring oscillator which has odd-numbered inverters connected in series, wherein an output of the inverter at a final stage is inputted into the inverter at a first stage to generate and output a clock signal;

a frequency divider which receives the clock signal outputted from the ring oscillator, and divides frequency thereof for output; and a heater which is on-off controlled based on the output of the frequency divider and heats the ring oscillator when turned on.

According to one aspect of the present invention, there is provided a clock generator comprising:

a ring oscillator which has odd-numbered inverters connected in series, wherein an output of the inverter at a final stage is inputted into the inverter at a first stage to generate and output a clock signal;

a dummy circuit which is formed adjacent to the ring oscillator and changes heating value based on a frequency of a drive signal; and a temperature control circuit which receives the clock signal outputted from the ring oscillator and generates and outputs the drive signal based on the clock signal.

BRIEF DESCRIPTION OF THE DRAWINGS

FIG. 3 is a timing chart illustrating output signal value and ring oscillator temperature of each part in a clock generator according to the first embodiment;

FIG. 4 is a view illustrating a layout of a ring oscillator formed with a polysilicon heater;

FIG. 10 is a schematic configurational view of 5/8 pulse generator;

FIG. 11 is a timing chart of I/O signal of 5/8 pulse generator;

FIG. 12 is a schematic configurational view of 6/8 pulse generator;

FIG. 13 is a timing chart of I/O signal of 6/8 pulse generator; and

FIG. 14 is a graph illustrating a frequency progress of a drive signal outputted from a temperature control circuit.

DESCRIPTION OF THE EMBODIMENTS

Referring now to the accompanying drawings, description will be made on a clock generator according to embodiments of the present invention.

First Embodiment

Figure 1:
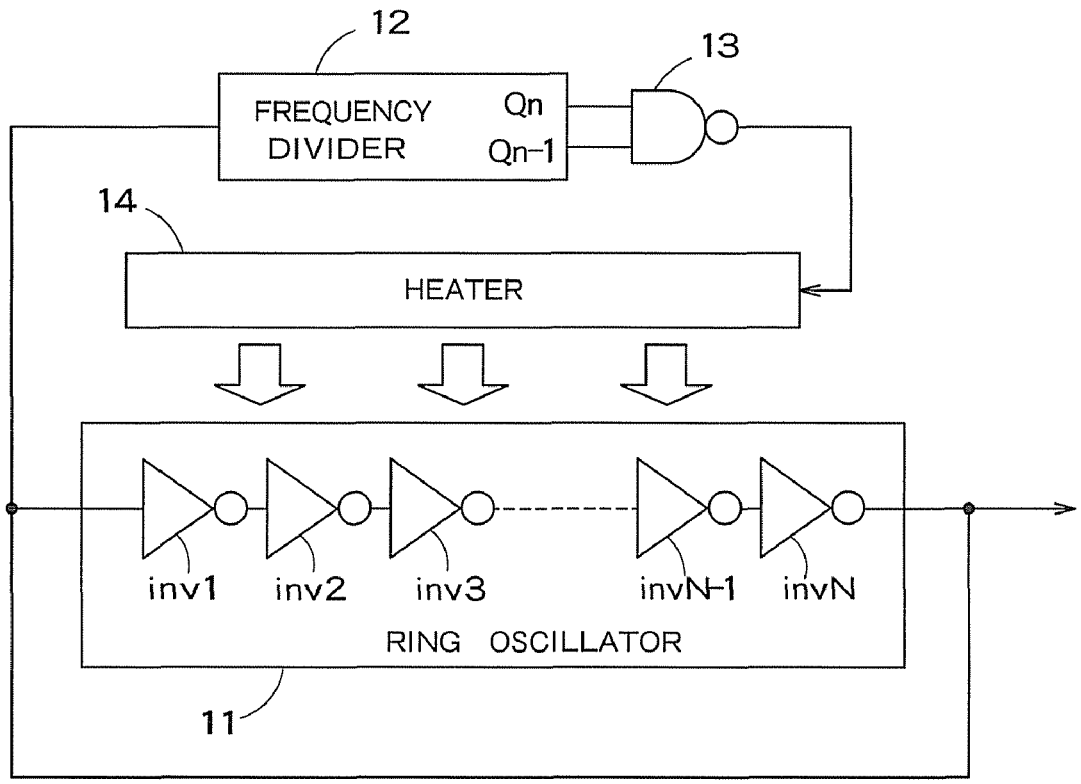
FIG. 1 is a schematic configurational view of a clock generator according to a first embodiment of the present invention.

FIG. 1 is a schematic configurational view of a clock generator according to a first embodiment of the present invention. The clock generator includes a ring oscillator 11, a frequency divider 12, a NAND gate 13 and a heater 14.

The ring oscillator 11 has inverters inv1 to invN the quantity of which is N (N: Odd number). Outputs of the respective inverters are inputted into the next stage of inverter and an output of the final stage of inverter invN is inputted into the first stage of inverter inv1, and a ring configuration is formed as a whole.

An inverter chain having inverters the number of which is N becomes a logical NOT of an input as a whole. The inverters have a delay time, respectively, and at a predetermined delay time after an input into the first stage of inverter inv1, the final stage of inverter invN outputs a logical NOT of the first stage of input and the logical NOT is inputted into the first stage of inverter inv1 again. By repeating this process, oscillation is made. If a delay time per one stage of inverter is taken as τ, an oscillation frequency f becomes f=1/(2×N×τ).

An output of the ring oscillator 11 is inputted into the frequency divider 12. Of outputs of the frequency divider 12, a first-most significant bit Qn and a second-most significant bit Qn-1 are given to the NAND gate 13. The heater 14 is on-off controlled based on an output value of the NAND gate 13. For example, when an output value of the NAND gate 13 is 0, the heater 14 is turned on and, when an output value thereof is 1, the heater 14 is turned off.

Figure 2:
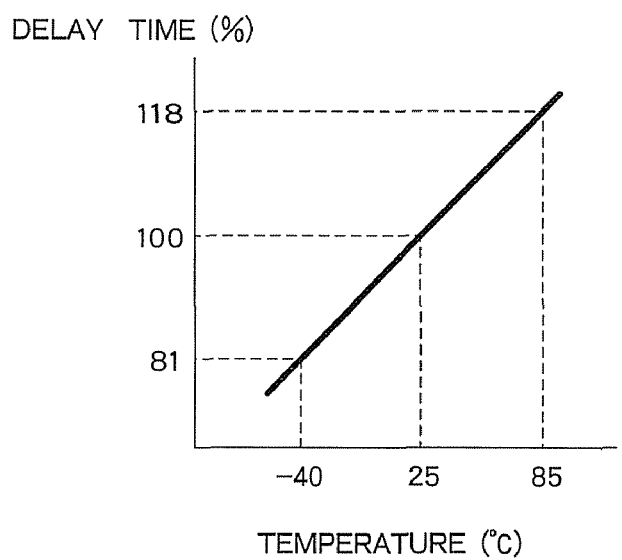
FIG. 2 is a graph illustrating a relationship between delay time and temperature of an inverter.

The heater 14 heats the ring oscillator 11. As illustrated in FIG. 2, there is the characteristic that the delay time of the inverters inv1 to invn included in the ring oscillator 11 changes with temperature. The delay time of the respective inverters, if a delay time of +25° C. is 100%, changes within the range of 81% to 118% between −40° C. to +80° C. and therefore oscillation frequency as well changes at the rate.

Accordingly, the heater 14 turn on and, after heating, the delay time of the ring oscillator 11 increases and oscillation frequency lowers. On the contrary, the heater 14 turns off and the temperature of the ring oscillator 11 lowers, the oscillation frequency increases.

For example, if a change of −100 kHz to +100 kHz is given to a reference clock of 100 MHz, an EMI spectrum can be reduced significantly and therefore it is sufficient to give a temperature bias of approximately 0.7° C. to the ring oscillator 11 by performing heating with the heater 14. A preferable period is such that a frequency change makes one vertical movement during 33 μs and therefore it is preferable that a temperature bias of approximately 0.7° C. is given at a period of 33 μs. Accordingly, preferably, the frequency divider 12 divides an output signal of the ring oscillator 11 into approximately 30 kHz.

FIG. 3 is a timing chart of each of output of the frequency divider 12, output value of the NAND gate 13, turning-on/off of the heater 14, temperature of the ring oscillator 11 and oscillation frequency (pulse waveform).

While the heater 14 is on, a pulse duration gradually becomes wider and oscillation frequency lowers. While the heater 14 is off, pulse duration gradually becomes narrower, and the oscillation frequency becomes higher.

Using the most-significant 2 bits Qn, Qn-1 of outputs of the frequency divider 12, on-off control of the heater 14 is performed and therefore on-period of the heater 14 is ¼. This is because it takes more time to perform cooling than heating the ring oscillator 11. The on-period of the heater 14 can be determined by the characteristics of the heater 14 or the ring oscillator 11. For example, using the most-significant 3 bits Qn, Qn-1, Qn-2 of outputs of the frequency divider 12, the on-period of the heater 14 can be reduced to ⅛.

The clock generator according to the present embodiment changes a temperature of the ring oscillator 11 by turning on and off the heater 14 to change oscillation frequency, thus generating a clock signal having steady oscillations in the frequency.

For the heater 14, for example, a heater with polysilicon may be used. FIG. 4 illustrates an example of a layout with CMOS semiconductor of a ring oscillator formed with a polysilicon heater. In addition, FIG. 4 illustrates a part of the ring oscillator and the heater. By repeatedly using this layout, the ring oscillator and the heater are constructed.

A source region 42 and a drain region 43 of a P-channel FET (Field Effect Transistor) and a source region 44 and a drain region 45 of an N-channel FET are generated at a surface portion of a semiconductor substrate. A gate electrode 41 is formed, through a gate oxide film, on a semiconductor substrate between the source region 42 and the drain region 43 of the P-channel FET and between the source region 44 and the drain region 45 of the N-channel FET.

The source region 42 of the P-channel FET is connected with a power supply potential line VDD. The source region 44 of the N-channel FET is connected with a ground potential line VSS.

The gate electrode 41 is a polysilicon layer and a polysilicon heater 46 is processed according to the same process as the gate electrode 41.

One end of the heater 46 is connected with the power supply potential line VDD and the other end thereof is connected with a heater control line 47. The heater control line 47 is connected with an output terminal of the NAND gate 13 in FIG. 1. When a potential difference occurs between the power supply potential line VDD and the heater control line 47, an electric current flows through the polysilicon heater 46 to generate heat. This allows heating of a transistor (an inverter constructing the ring oscillator) formed below the polysilicon heater 46.

The polysilicon heater 46 can be structured to have a desired heating capacity by changing a length according to heating watt capacity thereof.

The polysilicon heater 46 is formed flush with the gate electrode 41 when viewed from the semiconductor substrate. Accordingly, a distance to a diffusion layer (source regions 42, 44, drain regions 43, 45) can be reduced, heat transfer can be quickened and heating period (heater on-period) can be shortened.

Figure 5:
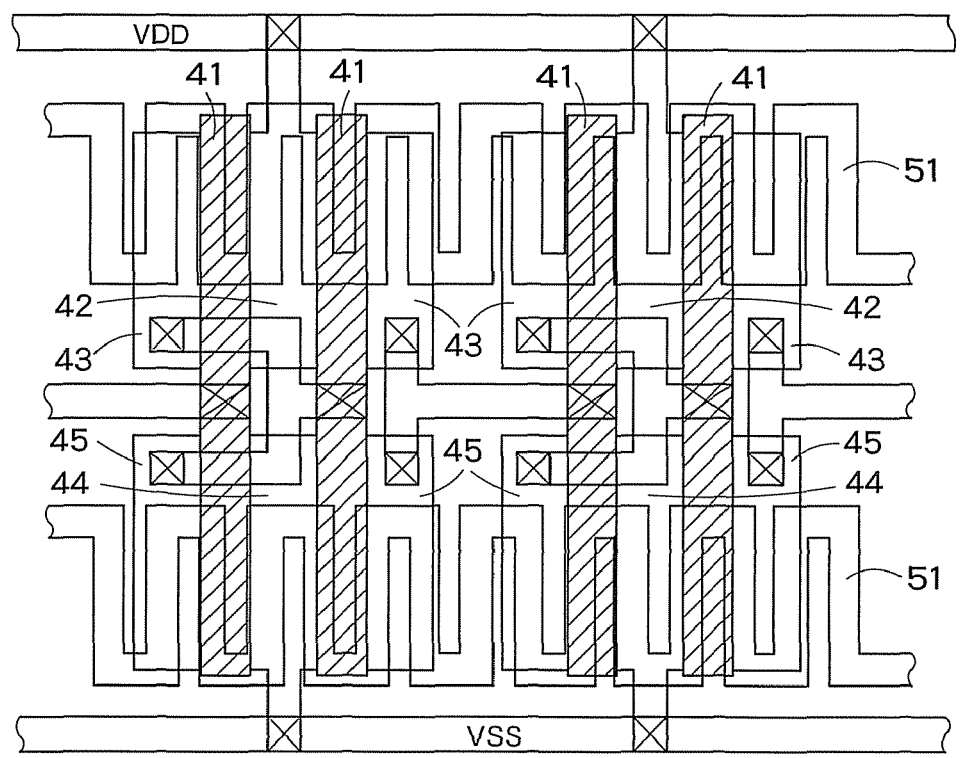
FIG. 5 is a view illustrating a layout of a ring oscillator formed with an aluminum wiring heater.

For the heater 14, an aluminum wiring may be used in place of polysilicon. FIG. 5 illustrates an example of a layout with CMOS semiconductor of a ring oscillator formed with an aluminum wiring heater. Components except an aluminum wiring heater 51 are the same as in FIG. 4 and therefore the same reference numerals/characters are allocated and description thereof will not be repeated.

One end of the aluminum wiring heater 51 is connected with the power supply potential line VDD and the other end thereof is connected with a heater control line (not illustrated). However, in FIG. 5, no contact points are illustrated between the power supply potential line VDD, the heater control line and the aluminum wiring heater 51. The aluminum wiring heater 51 is formed at a higher position than the polysilicon heater 46 illustrated in FIG. 4, when viewed from the semiconductor substrate. Accordingly, the aluminum wiring heater 51 can uniformly heat a transistor (source regions 42, 44 and drain regions 43, 45) constructing the ring oscillator.

As described above, the clock generator according to the present embodiment can produce a clock signal having a large EMI noise reduction effect by turning on and off the heater to change the temperature of the ring oscillator and give steady oscillations to oscillation frequency. Use of the ring oscillator having odd-numbered inverters connected in series in place of a PLL circuit facilitates a circuit configuration, thus attaining cost reduction.

Second Embodiment

Figure 6:
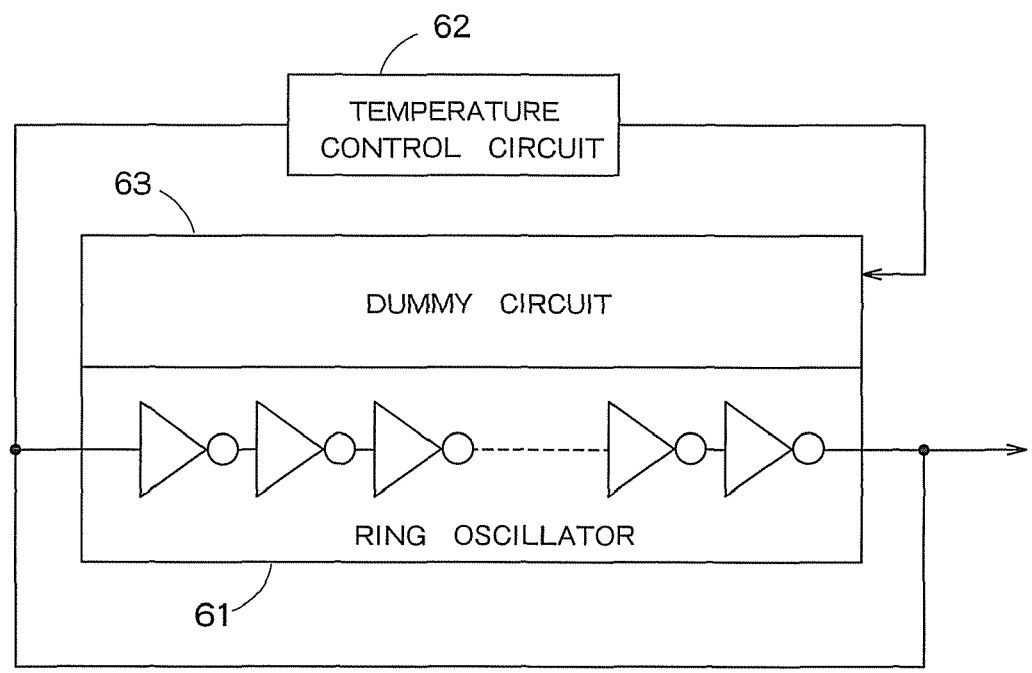
FIG. 6 is a schematic configurational view of a clock generator according to a second embodiment of the present invention.

FIG. 6 is a schematic configurational view of a clock generator according to a second embodiment of the present invention. The clock generator includes a ring oscillator 61, a temperature control circuit 62 and a dummy circuit 63. The ring oscillator 61 has a configuration with odd-numbered inverters connected in a chain form in the same way as the ring oscillator 11 according to the first embodiment. The temperature control circuit 62 receives an oscillation clock signal outputted from the ring oscillator 61 and outputs a drive signal to the dummy circuit 63.

The dummy circuit 63 has inverters connected in series in the same way as the ring oscillator 61. The inverters of the dummy circuit 63 and the inverters of the ring oscillator 61 are alternately formed on the semiconductor substrate.

As illustrated in the first embodiment, the ring oscillator 61 changes oscillation frequency by heating (temperature changes). The clock generator according to the embodiment controls heating of the ring oscillator 61 by arranging dummy circuits 63 to be skewered inside the ring oscillator 61 and controlling fluctuations in heat generated by the operation.

Figure 7:
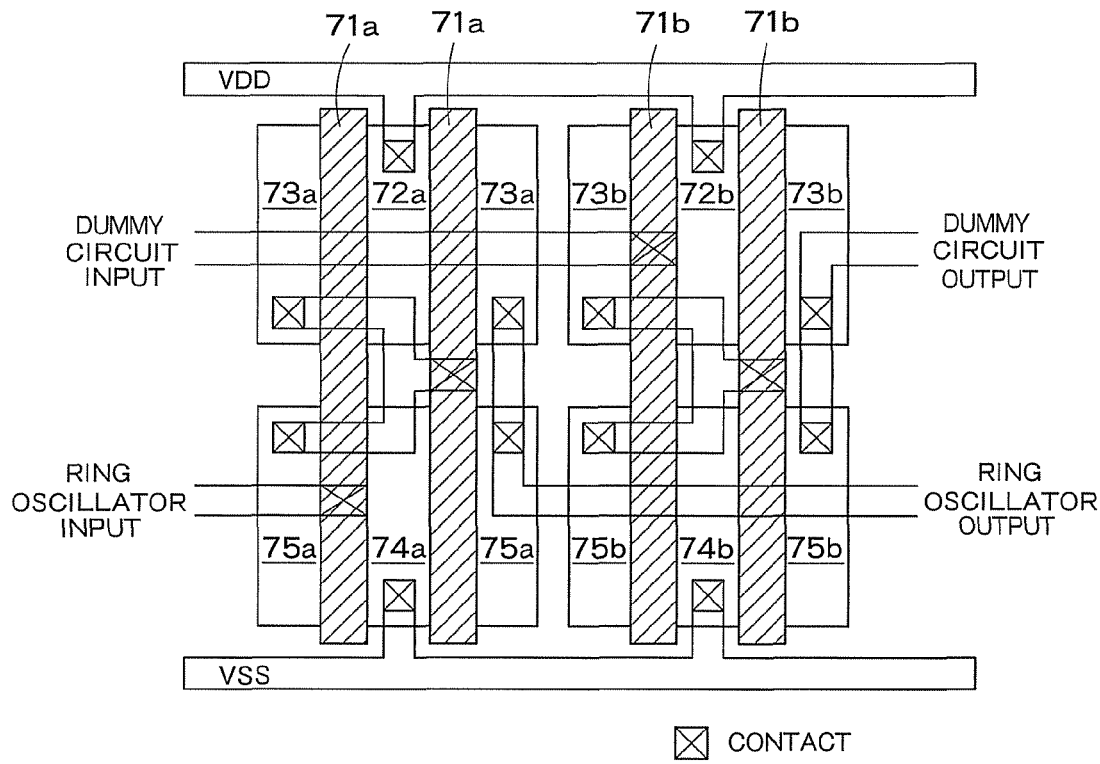
FIG. 7 is a view illustrating a layout of a ring oscillator and a dummy circuit.
Figure 7:
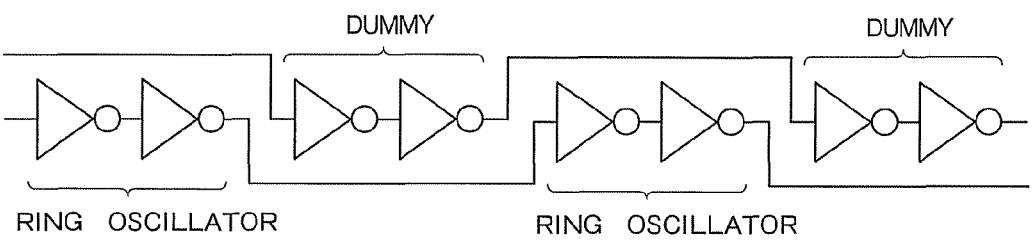

FIG. 7(a) illustrates an example of a layout with CMOS semiconductors of the ring oscillator and the dummy circuit. In addition, FIG. 7(a) illustrates a part of the ring oscillator and the dummy circuit. By repeatedly using this layout, the ring oscillator and the dummy circuit are constructed.

Source regions 72a, 72b and drain regions 73a, 73b of a P-channel FET and source regions 74a, 74b and drain regions 75a, 75b of an N-channel FET are formed on a surface portion of a semiconductor substrate.

A gate electrode 71a is formed, through a gate oxide film, on a semiconductor substrate between the source region 72a and the drain region 73a of the P-channel FET and between a source region 74a and a drain region 75a of the N-channel FET.

A gate electrode 71b is formed, through a gate oxide film, on the semiconductor substrate between the source region 72b and the drain region 73b of the P-channel FET and between a source region 74b and a drain region 75b of the N-channel FET.

The source regions 72a, 72b of the P-channel FET is connected with a power supply potential line VDD. In addition, the source regions 74a, 74b of the N-channel FET are connected with a ground potential line VSS.

An inverter including a PMOS transistor having the gate electrode 71a and diffusion layers (source-drain region) 72a, 73a and an NMOS transistor having the gate electrode 71a and the diffusion layers (source-drain region) 74a, 75a is an inverter included in the ring oscillator 61.

An inverter including a PMOS transistor having the gate electrode 71b and diffusion layers (source-drain region) 72b, 73b and an NMOS transistor having the gate electrode 71b and the diffusion layers (source-drain region) 74b, 75b is an inverter included in the dummy circuit 63.

By repeatedly using such a layout, a configuration in which an inverter of the ring oscillator 61 and an inverter of a dummy circuit 63 are alternately formed for every two-stage can be implemented, as illustrated in FIG. 7(b).

The dummy circuit 63 operates on a drive signal outputted from the temperature control circuit 62. The inverter of the dummy circuit 63 generates heat with the operation of the dummy circuit 63, thus heating the inverter of the adjacent ring oscillator 61 by thermal diffusion. That is, the dummy circuit 63 serves as a heater.

Figure 8:
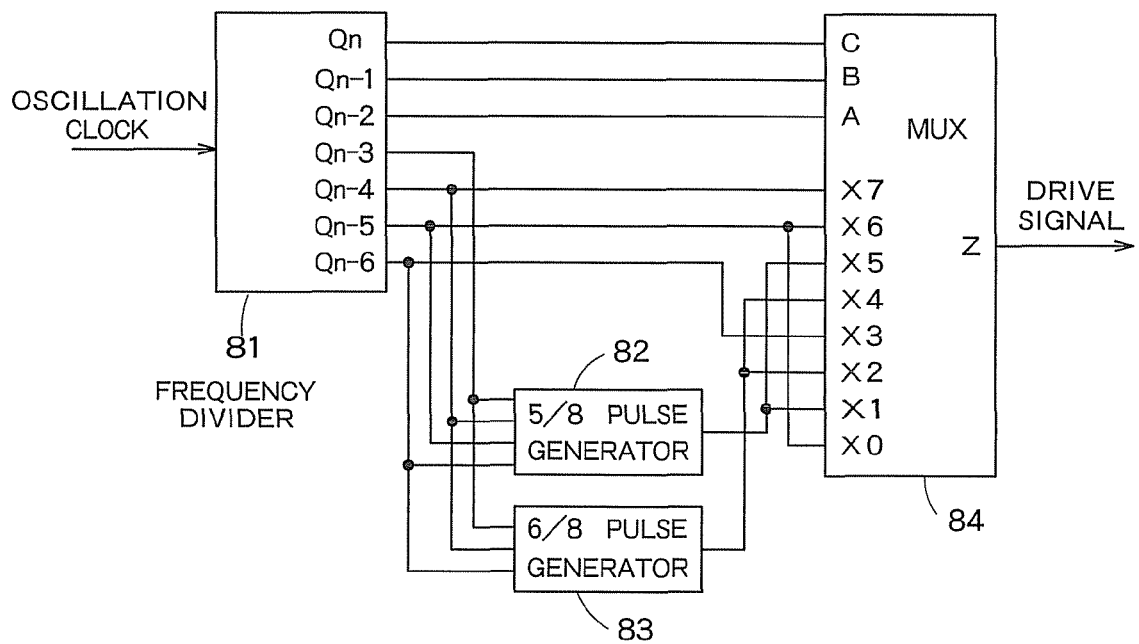
FIG. 8 is a schematic configurational view of a temperature control circuit.

FIG. 8 illustrates a schematic configuration of the temperature control circuit 62. The temperature control circuit 62 includes a frequency divider 81, a 5/8 pulse generator 82, a 6/8 pulse generator 83 and a multiplexer 84.

Figure 9:
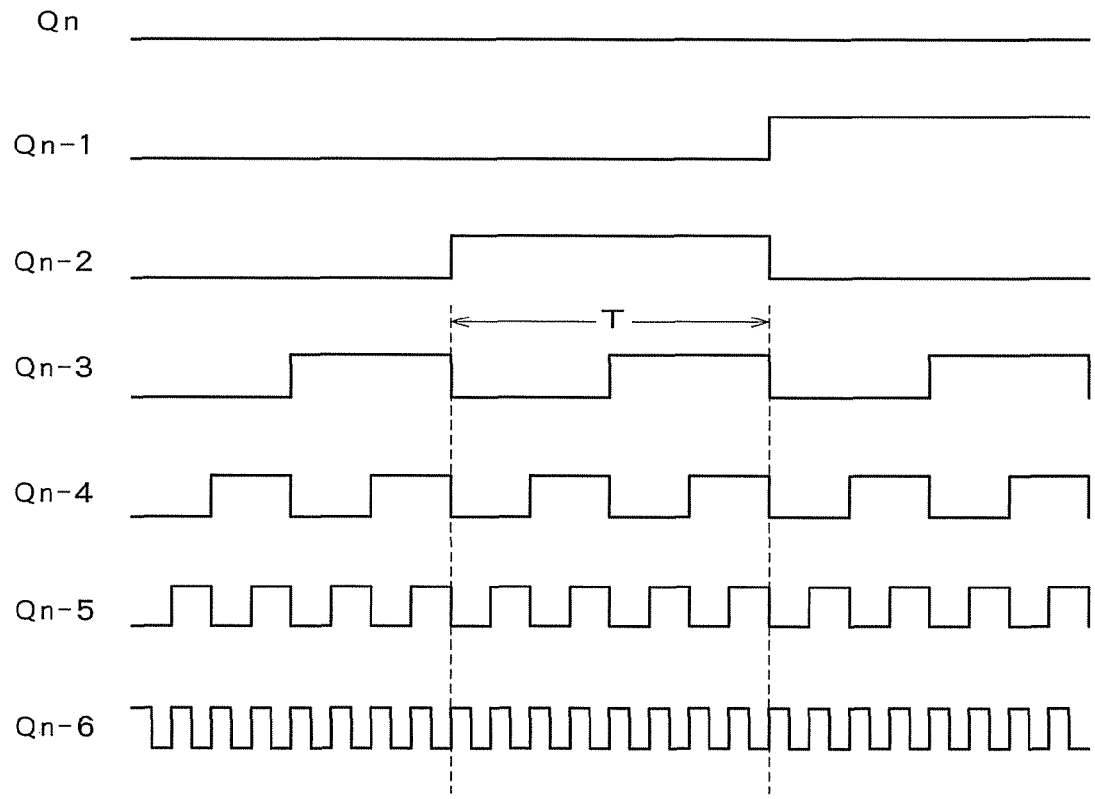
FIG. 9 is a view illustrating a timing chart of the most significant 7 bits outputted from a frequency divider.

The frequency divider 81 receives an oscillation clock signal outputted from a ring oscillator (not illustrated), performs frequency division and outputs most significant 7 bits Qn to Qn-6. FIG. 9 illustrates timing charts of most significant 7 bits Qn to Qn-6. During a certain time T when Qn-3 bit generates by one pulse, Qn-4 bit generates by two pulses, Qn-5 bit generates by four pulses and Qn-6 bit generates by eight pulses.

The 5/8 pulse generator 82 receives Qn-3 to Qn-6 bits from a frequency divider 81, and outputs a signal of generating five pulses during a certain time T. FIG. 10 illustrates a schematic configurational view of 5/8 pulse generator 82. Qn-5 bit and Qn-4 bit are given to an AND gate 101. The output of the AND gate 101 and Qn-3 bit are given to OR gate 102.

The output of the OR gate 102 and Qn-6 bit are given to an AND gate 103. As illustrated in FIG. 11, a signal of generating five pulses during a certain time T is outputted from the AND gate 103.

A 6/8 pulse generator 83 receives Qn-3 bit, Qn-4 bit and Qn-6 bit from the frequency divider 81 and outputs a signal of generating six pulses during a certain time T. FIG. 12 illustrates a schematic configurational view of 6/8 pulse generator 83. Qn-3 bit and Qn-4 bit are given to the OR gate 121.

The output of the OR gate 121 and Qn-6 bit are given to the AND gate 122. As illustrated in FIG. 13, a signal of generating six pulses during a certain time T is outputted from the AND gate 122.

As illustrated in FIG. 8, Qn-5 bit, an output of the 5/8 pulse generator 82, an output of the 6/8 pulse generator 83, Qn-6 bit, an output of the 6/8 pulse generator 83, an output of 5/8 pulse generator 82 and Qn-4 bit are given to input terminals X0 to X7 of the multiplexer 84, respectively.

The multiplexer 84 sequentially selects one of the input terminals X0 to X7 for each section of the time divided into 8 portions using Qn to Qn-2 bits outputted from the frequency divider 81 and outputs a signal given from the input terminal as a drive signal. Accordingly, the operating frequency of an output signal of the multiplexer 84 changes for each section of the time divided into 8 portions.

FIG. 14 illustrates a frequency progress of an output signal of the multiplexer 84. At a time (section) t1, a signal (Qn-5 bit signal) given from the input terminal X0 is outputted. Thereafter, signals from the input terminals X1 at a time t2, X2 at a time t3, X3 at a time t4, X4 at a time t5, X5 at a time t6, X6 at a time t7 and X7 at a time t8 are outputted, respectively.

Specifically, if a frequency of an output signal at a time t8 is taken as 2 m, frequencies of output signals at t1 and t7, t2 and t6, t3 and t5, and t4 are 4 m, 5 m, 6 m and 8 m, respectively.

Accordingly, as seen from FIG. 14, the frequency of a signal outputted from the multiplexer 84 repeatedly increases and decreases, and during a period from an increase to a decrease and during a period from a decrease to an increase, a variation in the frequency becomes larger. Preferably, an increase or decrease in the frequency is made once per 33 µs in the same way as the first embodiment. Specifically, it is preferable that the frequency increases or decreases at a period of approximately 30 kHz.

The heating value of the dummy circuit 63 is proportional to the frequency of a signal (drive signal) outputted from the multiplexer 84 and therefore a variation in the heating value of the dummy circuit 63 is also as illustrated in FIG. 14. Accordingly, the temperature (and temperature-dependent oscillation frequency) of the ring oscillator 61 also repeatedly increases or decreases in the same way, and during a period from an increase to a decrease and during a period from a decrease to an increase, a variation becomes larger. Such a change in the frequency performs a behavior next to a so-called Hershey Kiss waveform, thus increasing an effect of EMI spectrum reduction.

As described above, the clock generator according to the embodiment is configured so that an inverter constructing a ring oscillator and an inverter constructing a dummy circuit are alternately formed to heat the ring oscillator by the heat generated by driving the dummy circuit and give oscillation to oscillation frequency, thus reducing EMI noise. In addition, by periodically changing the frequency of a drive signal of the dummy circuit, heating value is changed to generate a clock signal having steady oscillation.

In the present embodiment, the temperature control circuit 62 divides time into eight portions to change the frequency of a drive signal to be outputted between respective sections, but the time may be divided into 16 or more portions. In addition, as the drive signal to be outputted, a signal of generating two to eight pulses during a certain time T is selected, but the signal may be selected from signals generating 2 to 64 pulses. Thus, the heating value (ring oscillator temperature) of the dummy circuit can be further controlled with high accuracy.

In the foregoing embodiment, a portion which requires no wiring above the heater may be filled with aluminum. Aluminum, having high heat conductivity, enables highly efficient cooling when the heater is off. Accordingly, balancing between heating time and cooling time becomes better, thus further increasing EMI spectrum reduction.

What is claimed is:

1. A clock generator comprising:
   a ring oscillator which has odd-numbered inverters connected in series, wherein an output of the inverter at a final stage is inputted into the inverter at a first stage to generate and output a clock signal;
   a frequency divider which receives the clock signal outputted from the ring oscillator, and divides frequency thereof for output;
   a NAND gate to which higher n-bits (n: 2 or higher integer) of outputs of the frequency divider, is given; and
   a heater which is on-off controlled based on an output of the NAND gate and heats the ring oscillator when turned on.

2. The clock generator according to claim 1, wherein the heater turns on when an output value of the NAND gate is 1 and turns off when the output value is 0.

3. The clock generator according to claim 1, wherein the delay time of the inverter increases when the heater is on and decreases when the heater is off.

4. The clock generator according to claim 1, wherein the frequency divider divides an output signal of the ring oscillator into 30 kHz.

5. The clock generator according to claim 1, wherein the heater includes a polysilicon film formed on a semiconductor substrate.

6. The clock generator according to claim 5, wherein a height of the heater from a surface of the semiconductor substrate is equal to heights of gate electrodes of an NMOS transistor and a PMOS transistor constructing the inverter from the surface.

7. The clock generator according to claim 6, wherein one end of the heater is connected to a power supply potential line connected with a source region of the PMOS transistor and the other end is connected to an output of the frequency divider.

8. The clock generator according to claim 5, further comprising an aluminum layer above the heater.

9. The clock generator according to claim 1, wherein the heater includes an aluminum wiring formed above the inverter.

10. A clock generator comprising:
    a ring oscillator which has odd-numbered inverters connected in series, wherein an output of the inverter at a final stage is inputted into the inverter at a first stage to generate and output a clock signal;
    a dummy circuit which is formed adjacent to the ring oscillator and changes heating value based on a frequency of a drive signal; and
    a temperature control circuit which receives the clock signal outputted from the ring oscillator and generates and outputs the drive signal based on the clock signal
    wherein the dummy circuit has a plurality of inverters connected in series and the inverter included in the ring oscillator and the inverter included in the dummy circuit are alternately formed on a semiconductor substrate.

11. The clock generator according to claim 10 wherein the inverter included in the ring oscillator and the inverter included in the dummy circuit are alternately formed on the semiconductor substrate for each two-stage.

12. The clock generator according to claim 10, wherein a delay time of the inverter of the ring oscillator increases with an increase of a frequency of the drive signal and decreases with a decrease of the frequency.

13. The clock generator according to claim 10, wherein the temperature control circuit includes:
    a frequency divider which receives the clock signal and outputs higher 7 bits after frequency division;
    a 5/8 pulse generator which receives higher 4th to 7th bit of the higher 7 bits and generates a signal of generating five pulses during a period when a higher 4th bit generates one pulse;
    a 6/8 pulse generator which receives a higher 4th bit, 5th bit and 7th bit of the higher 7 bits and generates a signal of generating six pulses during a period when the 4th bit generates one pulse; and
    a multiplexer which receives higher 1st to 3rd bits and 5th to 7th bits of the higher 7 bits, an output of the 5/8 pulse generator and an output of the 6/8 pulse generator, selects any one of the higher 5th to 7th bits, an output of the 5/8 pulse generator and an output of the 6/8 pulse generator based on values of the higher 1st to 3rd bits and outputs the selected one as the drive signal.

14. The clock generator according to claim 13, wherein the 5/8 pulse generator includes:
    a first AND gate which receives the higher 5th and 6th bits;
    an OR gate which receives the higher 4th bit and an output of the first AND gate; and
    a second AND gate which receives the higher 7th bit and an output of the OR gate.

15. The clock generator according to claim 13, wherein the 6/8 pulse generator includes:
    an OR gate which receives the higher 4th and 5th bits; and
    an AND gate which receives the higher 7th bit and an output of the OR gate.

16. The clock generator according to claim 13, wherein the multiplexer selects any one of the higher 5th to 7th bits, an output of the 5/8 pulse generator and an output of the 6/8 pulse generator for each section of the time divided into 8 portions based on the values of the higher 1st to 3rd bits and outputs the selected one as the drive signal.

17. The clock generator according to claim 16, wherein the multiplexer which sequentially selects, for each section of the time divided into 8 portions, the higher 5th bit, higher 6th bit, an output of the 5/8 pulse generator, an output of the 6/8 pulse generator, higher 7th bit, an output of the 6/8 pulse generator, an output of the 5/8 pulse generator and the higher 6th bit and outputs the selected one as the drive signal.

18. The clock generator according to claim 10, further comprising an aluminum layer above the ring oscillator and the dummy circuit.

* * * * *